US012640744B2

(12) United States Patent
Sung

(10) Patent No.: US 12,640,744 B2
(45) Date of Patent: May 26, 2026

(54) INITIAL CONTROL VOLTAGE GENERATING CIRCUIT FOR VOLTAGE-CONTROLLED OSCILLATOR AND PHASE-LOCKED LOOP CIRCUIT WITH THE INITIAL CONTROL VOLTAGE GENERATING CIRCUIT

(71) Applicant: SK hynix Inc., Icheon-si (KR)

(72) Inventor: Ki Hyuk Sung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/899,355

(22) Filed: Sep. 27, 2024

(65) Prior Publication Data

US 2025/0125811 A1     Apr. 17, 2025

(30) Foreign Application Priority Data

Oct. 16, 2023     (KR) ........................ 10-2023-0138083

(51) Int. Cl.
*H03L 7/099*         (2006.01)
*H03K 5/00*         (2006.01)
*H03L 7/089*         (2006.01)

(52) U.S. Cl.
CPC ......... *H03L 7/099* (2013.01); *H03K 5/00006* (2013.01); *H03L 7/0891* (2013.01)

(58) Field of Classification Search
CPC ...................................................... H03L 7/099
USPC ...................................................... 331/1 R
See application file for complete search history.

(56) References Cited

U.S. PATENT DOCUMENTS

| | | | | |
|---|---|---|---|---|
| 4,682,054 | A | * | 7/1987 | McLaughlin .... H03K 19/09448 326/26 |
| 5,341,431 | A | * | 8/1994 | Griessman ............. H04H 20/49 331/DIG. 2 |
| 5,559,448 | A | * | 9/1996 | Koenig ................... H03H 11/30 326/86 |
| 6,147,520 | A | * | 11/2000 | Kothandaraman ......................... H04L 25/0298 327/513 |
| 2008/0106297 | A1* | | 5/2008 | Jao ........................ H03K 17/164 326/27 |
| 2017/0199228 | A1* | | 7/2017 | Hsieh ................. G01R 31/2851 |
| 2022/0294390 | A1* | | 9/2022 | Lal ........................ G01N 29/348 |

FOREIGN PATENT DOCUMENTS

| | | | | |
|---|---|---|---|---|
| CN | 111835344 A | * 10/2020 | ........... H03L 7/0805 |
| KR | 10-2008-0043578 A | 5/2008 | |
| KR | 10-2012-0061459 A | 6/2012 | |

* cited by examiner

*Primary Examiner* — Joseph Chang

(57)     ABSTRACT

An initial control voltage generating circuit for a voltage controlled oscillator (VCO) includes a resistor coupled between a supply voltage terminal and an output node from which the initial control voltage is output, and a transmission gate resistor coupled between the output node and a ground voltage terminal. The transmission gate resistor includes a P-channel type MOS (PMOS) transistor and an N-channel type MOS (NMOS) transistor coupled in parallel between the output node and the ground voltage terminal.

20 Claims, 10 Drawing Sheets

INITIAL CONTROL VOLTAGE GENERATING CIRCUIT FOR VOLTAGE-CONTROLLED OSCILLATOR AND PHASE-LOCKED LOOP CIRCUIT WITH THE INITIAL CONTROL VOLTAGE GENERATING CIRCUIT

CROSS-REFERENCE TO RELATED APPLICATION

The present application claims priority under 35 U.S.C 119(a) to Korean Application No. 10-2023-0138083, filed on Oct. 16, 2023, which is incorporated herein by references in its entirety.

BACKGROUND

1. Technical Field

Various embodiments of the present disclosure relate to an initial control voltage generating circuit for a voltage-controlled oscillator (VCO) and a phase locked loop (PLL) circuit with the initial control voltage generating circuit.

2. Related Art

A PLL receives a reference frequency signal and can use the reference frequency signal to generate output signals with various frequencies higher than the frequency of the reference frequency signal. Electronic devices are designed to operate based on clock signals with specific frequencies, and thus PLLs are used in such electronic devices. Until the frequency of an output frequency signal of a PLL is locked to a target frequency, the electronic device may not operate normally. Therefore, as the locking speed of the PLL increases, the operation speed of the electronic device can be increased.

SUMMARY

An initial control voltage generating circuit for a voltage controlled oscillator (VCO) according to an embodiment of the present disclosure may include a resistor coupled between a supply voltage terminal and an output node from which the initial control voltage is output, and a transmission gate resistor coupled between the output node and a ground voltage terminal.

A phase locked loop (PLL) circuit according to an embodiment of the present disclosure may include a phase frequency detector configured to receive a reference signal and a feedback signal and to output an up-signal or a down-signal based on a phase difference between the reference signal and the feedback signal, a charge pump configured to output a control voltage based on the up-signal or down-signal, a voltage controlled oscillator (VCO) configured to generate and output an output signal having a first frequency corresponding to the control voltage, a frequency divider configured to generate the feedback signal having a second frequency and to transmit the feedback signal to the phase frequency detector, and an initial control voltage generating circuit configured to generate an initial control voltage during an initialization period and to provide the initial control voltage to the VCO. The initial control voltage generating circuit may include a resistor coupled between a supply voltage terminal and an output node from which the initial control voltage is output, and a transmission gate resistor coupled between the output node and a ground voltage terminal.

BRIEF DESCRIPTION OF THE DRAWINGS

Certain features of the disclosed technology are illustrated by various embodiments with reference to the attached drawings, in which:

FIG. 3 is a timing diagram illustrating input signals, a power-down signal, and a reset signal of the initial control signal generating circuit of FIG. 2, according to an embodiment of the present disclosure.

FIG. 9 is a block diagram illustrating a PLL circuit including the initial control voltage generating circuit according to an embodiment of the present disclosure.

DETAILED DESCRIPTION OF THE EMBODIMENTS

In the description of embodiments of the present disclosure, descriptions such as "first" and "second" are for distinguishing elements, and are not used to limit the members themselves or to mean a specific order. One component "connected" or "coupled" to another component may indicate that the one component is electrically or mechanically connected to another component, either directly or through one or more intermediate elements. The term "predetermined" indicates that the value of a parameter is predetermined when using that parameter in a process or algorithm. The value of the parameter may be set when a process or algorithm starts or may be set during a period during which a process or algorithm is performed, depending on embodiments.

"Logic high level" and "logic low level" are used to describe logic levels of signals. A signal having a "logic high level" is distinguished from a signal having a "logic low level." For example, when a signal having a first voltage corresponds to a "logic high level," a signal having a second voltage may correspond to a "logic low level." According to an embodiment, the "logic high level" may be set to a higher voltage than the "logic low level," but embodiments of the present disclosure are not limited thereto. For example, the "logic high level" may be set to a lower voltage than the "logic low level."

Various embodiments of the present disclosure will be described hereinafter in more detail with reference to the accompanying drawings.

Figure 1:
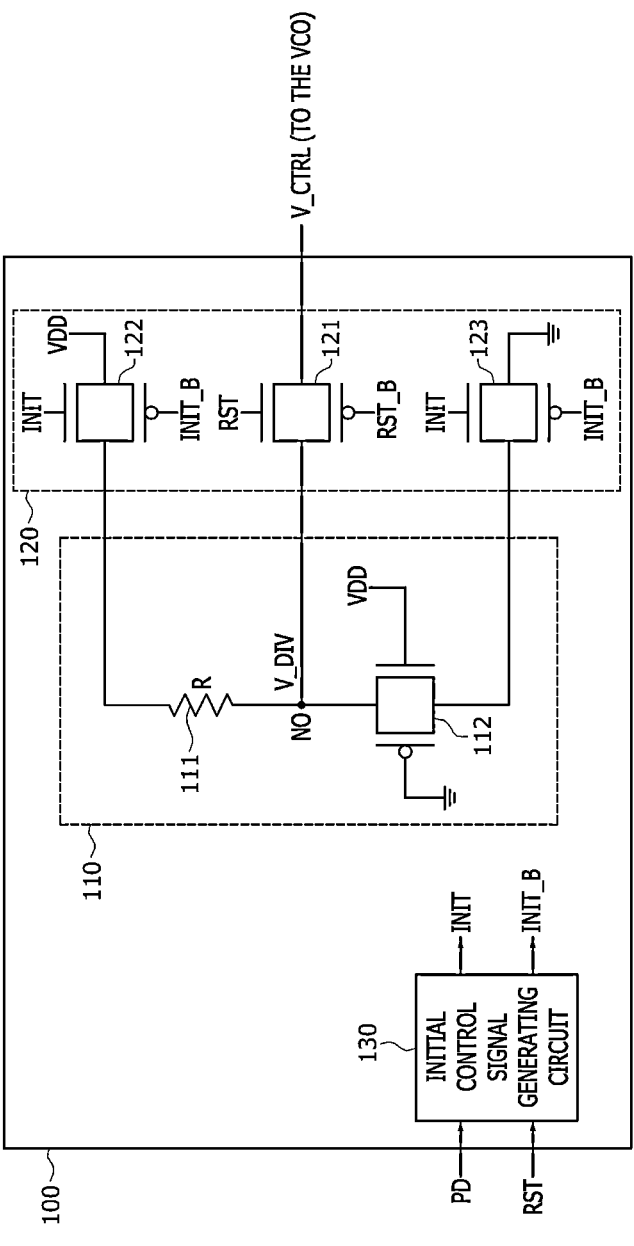
FIG. 1 illustrates an initial control voltage generating circuit for a VCO according to an embodiment of the present disclosure.

FIG. 1 illustrates an initial control voltage generating circuit 100 for a VCO according to an embodiment of the present disclosure.

Referring to FIG. 1, an initial control voltage generating circuit 100 includes a voltage divider circuit 110, a switching circuit 120, and an initial control signal generating circuit 130. The voltage divider circuit 110 includes a resistor 111 having a first resistor value R and a transmission gate resistor 112. The voltage divider circuit 110 outputs a divided voltage V_DIV at the output node NO. The divided voltage V_DIV is generated by dividing the supply voltage VDD by the resistor 111 and the transmission gate resistor 112. The switching circuit 120 includes first, second, and third switches. The first switch may be implemented as a first transmission gate switch 121. The second switch may be implemented as a second transmission gate switch 122. The third switch may be implemented as a third transmission gate switch 123. The switching circuit 120 performs a switching operation in which a supply voltage VDD and a ground voltage are applied to the voltage divider circuit 110 based on an initial control signal (or a first initial control signal) INIT and an initial control bar signal (or a second initial control signal) INIT_B that are complementary signals. Specifically, the switching circuit 120 connects or disconnects a supply voltage terminal to or from the resistor 111 of the voltage divider circuit 110 based on the first initial control signal INIT and the second initial control signal INIT_B. The switching circuit 120 also connects or disconnects a ground voltage terminal to or from the transmission gate resistor 112 of the voltage divider circuit 110 based on the first initial control signal INIT and the second initial control signal INIT_B. When the supply voltage terminal and the ground voltage terminal are connected to the resistor 111 and the transmission gate resistor 112 of the voltage divider circuit 110, respectively, the switching circuit 120 applies a supply voltage VDD to the resistor 111 through the second transmission gate switch 122 and applies a ground voltage to the transmission gate resistor 112 through third transmission gate switch 123. In addition, the switching circuit 120 performs a switching operation in which the divided voltage V_DIV output from the voltage divider circuit 110 is output from the initial control voltage generating circuit 100 as a control voltage V_CTRL based on a first reset signal RST and a second reset signal RST_B that are complementary signals. Specifically, the switching circuit 120 connects or disconnects the output node NO of the voltage divider circuit 110 to or from an output terminal of the initial control voltage generating circuit 100 based on the first reset signal RST and the second reset signal RST_B. When the output node NO is connected to the output terminal of the initial control voltage generating circuit 100, the switching circuit 120 passes the divided voltage V_DIV to output the control voltage V_CTRL at the output terminal. Hereinafter, the control voltage V_CTRL output from the initial control voltage generating circuit 100 may also be referred to as the term "initial control voltage."

More specifically, the resistor 111 of the voltage divider circuit 110 is coupled to an output terminal of the second transmission gate switch 122 of the switching circuit 120 and an output node NO of the voltage divider circuit 110. The output node NO is coupled to the output line of the voltage divider circuit 110 from which the control voltage V_CTRL is output. The transmission gate resistor 112 of the voltage divider circuit 110 has a structure in which a P-channel type MOS transistor (hereinafter "PMOS transistor") and an N-channel type MOS transistor (hereinafter "NMOS transistor") are coupled in parallel. In an embodiment, a source of the PMOS transistor and a source of the NMOS transistor constitute an input terminal the transmission gate resistor 112, and a drain of the PMOS transistor and a drain of the NMOS transistor constitute an output terminal of the transmission gate resistor 112. The input terminal of the transmission gate resistor 112 is coupled to the output node NO. The output terminal of the transmission gate resistor 112 is coupled to an output terminal of the third transmission gate switch 123 of the switching circuit 120. A gate of the PMOS transistor of the transmission gate resistor 112 is coupled to a ground voltage terminal to which the ground voltage is applied. A gate of the NMOS transistor of the transmission gate resistor 112 is coupled to a supply voltage terminal to which the supply voltage VDD is applied.

The first transmission gate switch 121, the second transmission gate switch 122, and the third transmission gate switch 123 of the switching circuit 120, like the transmission gate resistor 112, each have a structure in which a PMOS transistor and an NMOS transistor are coupled in parallel. In an embodiment, a source of the PMOS transistor and a source of the NMOS transistor of each of the first transmission gate switch 121, the second transmission gate switch 122, and the third transmission gate switch 123 constitute an input terminal of each of the first transmission gate switch 121, the second transmission gate switch 122, and the third transmission gate switch 123. A drain of the PMOS transistor and a drain of the NMOS transistor of each of the first transmission gate switch 121, the second transmission gate switch 122, and the third transmission gate switch 123 constitute an output terminal of each of the first transmission gate switch 121, the second transmission gate switch 122, and the third transmission gate switch 123.

The input terminal of the first transmission gate switch 121 is coupled to the output node NO of the voltage divider circuit 110. The output terminal of the first transmission gate switch 121 is coupled to the output line of the initial control voltage generating circuit 100. A reset signal (or a first reset signal) RST is applied to the gate of the NMOS transistor of the first transmission gate switch 121. A reset bar signal (or a second reset signal) RST_B is applied to the gate of the PMOS transistor of the first transmission gate switch 121. The first and second reset signals RST and RST_B are complementary signals. The input terminal of the second transmission gate switch 122 is coupled to the supply voltage terminal. The output terminal of the second transmission gate switch 122 is coupled to the resistor 111 of the voltage divider circuit 110. An initial control signal INIT is applied to the gate of the NMOS transistor of the second transmission gate switch 122. An initial control bar signal INIT_B is applied to the gate of the PMOS transistor of the second transmission gate switch 122. The input terminal of the third transmission gate switch 123 is coupled to the ground voltage terminal. The output terminal of the third transmission gate switch 123 is coupled to the output terminal of the transmission gate resistor 112 of the voltage divider circuit 110. The initial control signal INIT is applied to the gate of the NMOS transistor of the third transmission gate switch 123. The initial control bar signal INIT_B is applied to the gate of the PMOS transistor of the third transmission gate switch 123.

The initial control signal generating circuit 130 receives a power-down signal PD and the reset signal RST. The power-down signal PD and the reset signal RST may have a first logic level, such as a high level, or a second logic level, such as a low level. The initial control signal generating circuit 130 outputs the initial control signal INIT and the initial control bar signal INIT_B. The initial control signal generating circuit 130 transmits the initial control signal INIT to the gate of the NMOS transistor of the second transmission gate switch 122 and the gate of the NMOS transistor of the third transmission gate switch 123. The initial control signal generating circuit 130 transmits the initial control bar signal INIT_B to the gate of the PMOS transistor of the second transmission gate switch 122 and the gate of the PMOS transistor of the third transmission gate switch 123.

Figure 2:
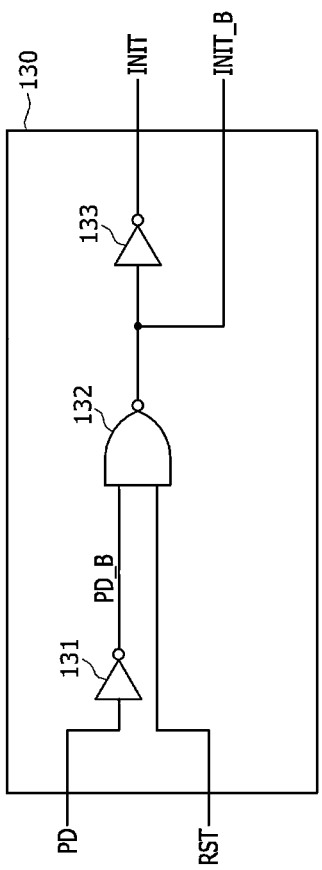
FIG. 2 illustrates an initial control signal generating circuit of the initial control voltage generating circuit of FIG. 1 according to an embodiment of the present disclosure.

FIG. 2 illustrates an initial control signal generating circuit 130 of the initial control voltage generating circuit 100 of FIG. 1 according to an embodiment of the present disclosure.

Referring to FIG. 2, an initial control signal generating circuit 130 includes a first inverter 131, a NAND gate 132, and a second inverter 133. The first inverter 131 receives a power-down signal PD (or a first power-down signal). The first inverter 131 outputs a power-down bar signal (or a second power-down signal) PD_B. For example, the second power-down signal PD_B is an inverted version of the first power-down signal PD to make the first and second power-down signals PD and PD_B complementary signals. The power-down bar signal PD_B has a logic level inverted from the logic level of the power-down signal PD. The NAND gate 132 receives the power-down bar signal PD_B output from the first inverter 131 through a first input terminal. The NAND gate 132 receives a reset signal RST through a second input terminal. The NAND gate 132 performs a NAND operation on the power-down bar signal PD_B and the reset signal RST. The NAND gate 132 outputs the signal generated as a result of the NAND operation as an initial control bar signal INIT_B through an output terminal. The second inverter 133 receives the initial control bar signal INIT_B output from the NAND gate 132 as input. The second inverter 133 outputs an initial control signal INIT that has a logic level inverted from the logic level of the initial control bar signal INIT_B.

Figure 3:
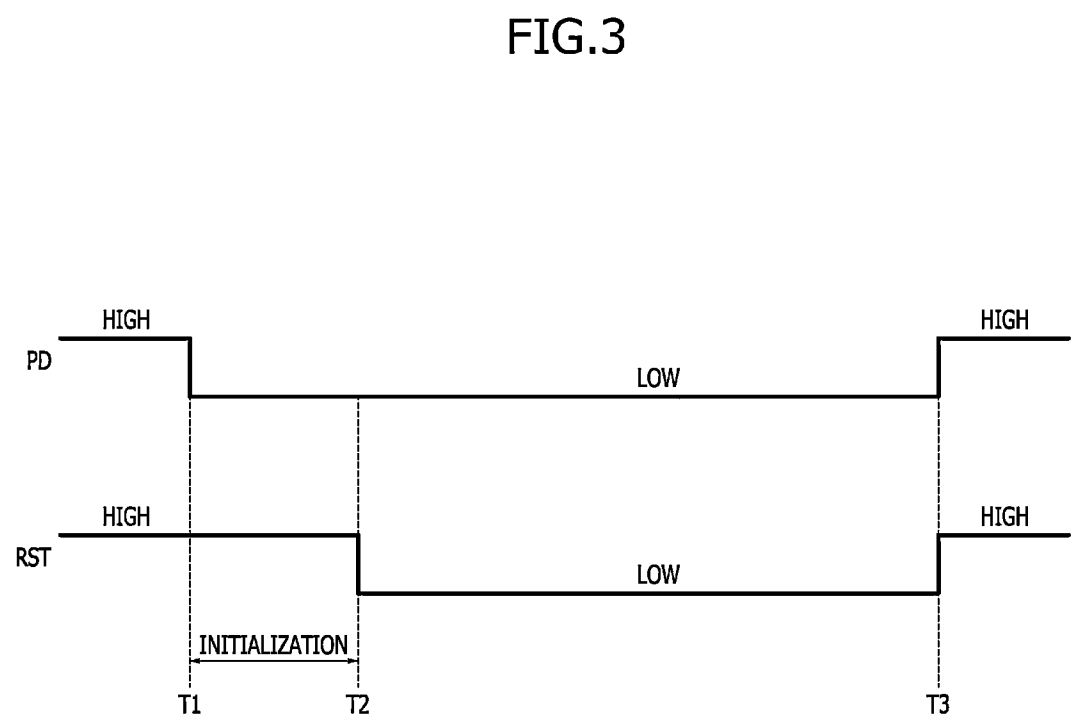

FIG. 3 is a timing diagram illustrating a power-down signal PD and a reset signal RST, which are input signals of the initial control signal generating circuit 130 of FIG. 2. In FIG. 3, the horizontal axis represents time, and the vertical axis represents a logic level of the power-down signal PD and the reset signal RST.

Referring to FIG. 3, when a power is turned on at the first time point T1, the logic level of the power-down signal PD changes from high level to low level. On the other hand, the logic level of the reset signal RST remains at a high level. At the second time point T2 that is a specific time interval after the first time point T1, for example, a time interval (or an initialization period) INITIALIZATION required to perform an initialization operation, the logic level of the reset signal RST is changed from a high level to a low level. At a third time point T3 when the power is turned off, the logic level of the power-down signal PD and the logic level of the reset signal RST are both changed from a low level to a high level. In this example, the initialization operation refers to an operation in which a control voltage V_CTRL is output from the initial control voltage generating circuit 100 of FIG. 1 and transmitted to the VCO. The initialization operation is performed while the logic level of the power-down signal PD is low and the logic level of the reset signal RST is high. In other words, the initialization operation is performed during the time interval INITIALIZATION from the first time T1 to the second time T2 in the timing diagram of FIG. 3. While the initialization operation is not performed, that is, while the reset signals of the power-down signal PD and the reset signal RST are both high level or both low level, the control voltage V_CTRL is not output from the initial control voltage generating circuit 100 of FIG. 1.

Figure 4:
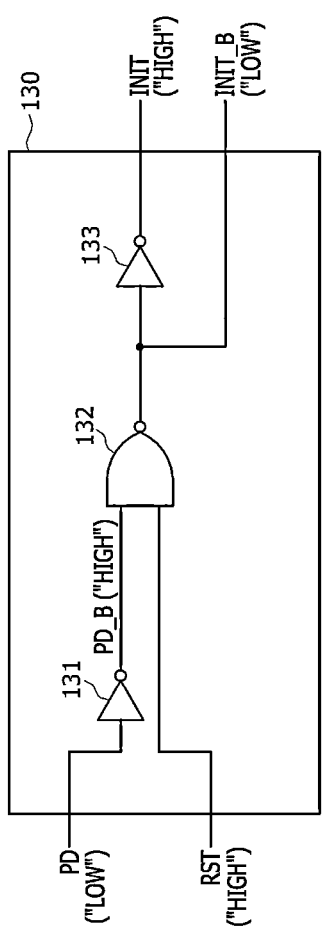
FIG. 4 is a circuit diagram illustrating an initialization operation of the initial control signal generating circuit of FIG. 2 according to an embodiment of the present disclosure.

FIG. 4 is a circuit diagram illustrating an initialization operation of the initial control signal generating circuit 130 of FIG. 2 according to an embodiment of the present disclosure. In FIG. 4, the same reference numerals as in FIG. 2 denote the same components.

Referring to FIG. 4, while the initialization operation is being performed (i.e., between the first time point T1 and the second time point T2 of FIG. 3), a low-level power-down signal PD is input to the first inverter 131, and a high-level reset signal RST is input to the second input terminal of the NAND gate 132. The first inverter 131 outputs a high-level power-down bar signal PD_B and transmits the high-level power-down bar signal PD_B to the first input terminal of the NAND gate 132. The NAND gate 132 outputs a low-level initial control bar signal INIT_B by performing a NAND operation on the high-level power-down bar signal PD_B and the high-level reset signal RST. The second inverter 133, which receives the low-level initial control bar signal INIT_B from the NAND gate 132, outputs the high-level initial control signal INIT.

Figure 5:
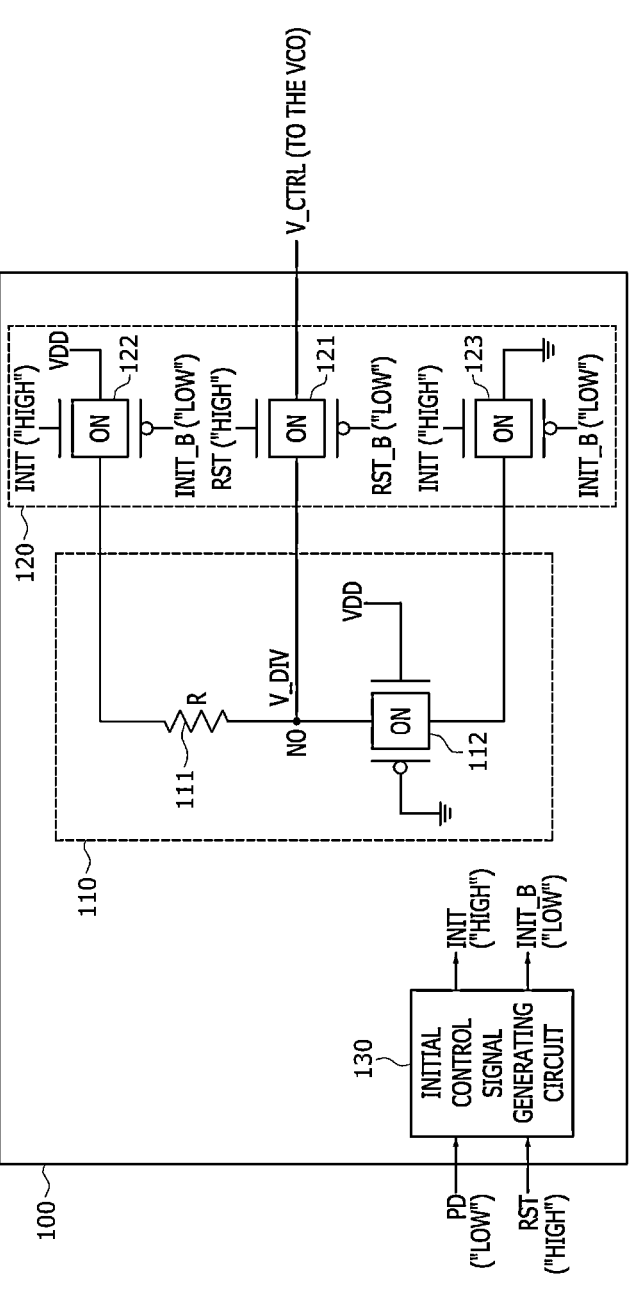
FIG. 5 is a circuit diagram illustrating an initialization operation of the initial control voltage generating circuit of FIG. 1 according to an embodiment of the present disclosure.

FIG. 5 is a schematic diagram shown to illustrate an initialization operation of the initial control voltage generating circuit 100 of FIG. 1. In FIG. 5, the same reference numerals as in FIG. 1 denote the same components.

Referring to FIG. 5, a high-level reset signal RST and a low-level reset bar signal RST_B are input to the gate of the NMOS transistor and the gate of the PMOS transistor of the first transmission gate switch 121, respectively. Accordingly, the first transmission gate switch 121 is switched on (or turned on). A high-level initial control signal INIT output from the initial control signal generating circuit 130 is input to the gate of the NMOS transistor of the second transmission gate switch 122 and the gate of the NMOS transistor of the third transmission gate switch 123. A low-level initial control bar signal INIT_B output from the initial control signal generating circuit 130 is input to the gate of the PMOS transistor of the second transmission gate switch 122 and the gate of the PMOS transistor of the third transmission gate switch 123. Accordingly, the second transmission gate switch 122 and the third transmission gate switch 123 are also switched on.

As the second transmission gate switch 122 is switched on, a supply voltage VDD is applied to the resistor 111 of the voltage divider circuit 110. As the third transmission gate switch 123 is switched on, ground voltage is applied to the output terminal of the transmission gate resistor 112 of the voltage divider circuit 110. As the supply voltage VDD and ground voltage are applied to the gate of the NMOS transistor and the gate of the PMOS transistor gate of the transmission gate resistor 112, respectively, the transmission gate resistor 112 remains turned on, such that the transmission gate resistor 112 functions as a resistor with a turn-on resistor value. The supply voltage VDD is divided by the resistor 111 and the transmission gate resistor 112, and thus the divided voltage V_DIV is generated at the output node NO. When the transmission gate resistor 112 is manufactured to have a turn-on resistor value substantially the same as the resistance value R of the resistor 111, the divided voltage V_DIV at the output node NO is about a half of the supply voltage VDD, that is, VDD/2. When the first transmission gate switch 121 is switched on, the divided voltage V_DIV at the output node NO is output as a control voltage V_CTRL through the output terminal of the first transmission gate switch 121 and provided to a VCO. Since the control voltage V_CTRL output from the initial control voltage generating circuit 100 has a value of VDD/2 instead of OV, the locking time interval, which is the time interval to reach from the initial value to the final value of the control voltage V_CTRL, is shortened. Here, final value means that the value of control voltage V_CTRL remains substantially constant.

In some embodiments, the PMOS transistor and NMOS transistor comprising the transmission gate resistor 112 may have a pair of transistor corners including any one of TT (Typical/Typical), FF (Fast/Fast), and SS (Slow/Slow). When the pair of transistor corners is TT, the PMOS transistor and the NMOS transistor of the transmission gate resistor 112 each have a target threshold voltage. Here, the target threshold voltage refers to a threshold voltage of the PMOS transistor and the NMOS transistor that causes the transmission gate resistor 112 to have a turn-on resistance value substantially equal to the resistance value of the resistor 111 of the voltage divider circuit 110. For example, the turn-on resistance value may be in a range of about 95% to about 105%, about 97% to about 103%, or about 99% to about 101% of the resistance value of the resistor 111. When the pair of transistor corners is FF, the PMOS transistor and NMOS transistor of the transmission gate resistor 112 each have a threshold voltage lower than the target threshold voltage. In this case, the transmission gate resistor 112 have a turn-on resistance value that is lower than the resistance value of the resistor 111 of the voltage divider circuit 110. When the pair of transistor corners is SS, the PMOS transistor and NMOS transistor of the transmission gate resistor 112 each have a threshold voltage higher than the target threshold voltage. In this case, the transmission gate resistor 112 have a turn-on resistance value higher than the resistance value of the resistor 111 of the voltage divider circuit 110.

As described with reference to FIG. 3, the control voltage V_CTRL input to the VCO from the initial control voltage generating circuit 100 takes a certain time interval to reach the final value from the initial value output from the initial control voltage generating circuit 100. When the pair of transistor corners is FF, the final value has a value less than VDD/2, and when the pair of transistor corners is SS, the final value has a value greater than VDD/2. When the pair of transistor corners is FF, the turn-on resistance value of the PMOS transistor and NMOS transistor of the transmission gate resistor 112 is smaller than the resistance value of the resistor 111, so the initial value of the control voltage V_CTRL output from the initial control voltage generating circuit 100 is also lower than VDD/2. Accordingly, the time interval required for the control voltage V_CTRL to reach the final value is shorter compared to the case where the initial value is VDD/2. Similarly, when the pair of transistor corners is SS, the turn-on resistance value of the PMOS transistor and NMOS transistor of the transmission gate resistor 112 is larger than the resistor value of the resistor 111, so the initial value of the control voltage V_CTRL output from the initial control voltage generating circuit 100 is also higher than VDD/2. As a result, the time interval required for the control voltage V_CTRL to reach the final value is shorter compared to the case where the initial value of the control voltage V_CTRL is VDD/2.

Figure 6:
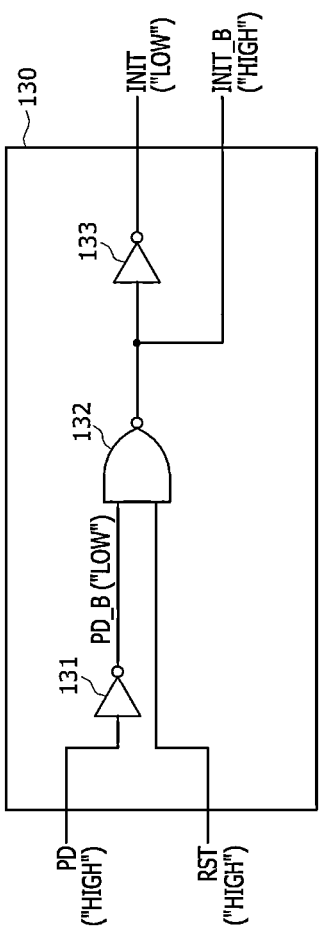
FIG. 6 is a circuit diagram illustrating an operation of the initial control signal generating circuit of FIG. 2 when each of the power-down signal and the reset signal has a high level, according to an embodiment of the present disclosure.
Figure 7:
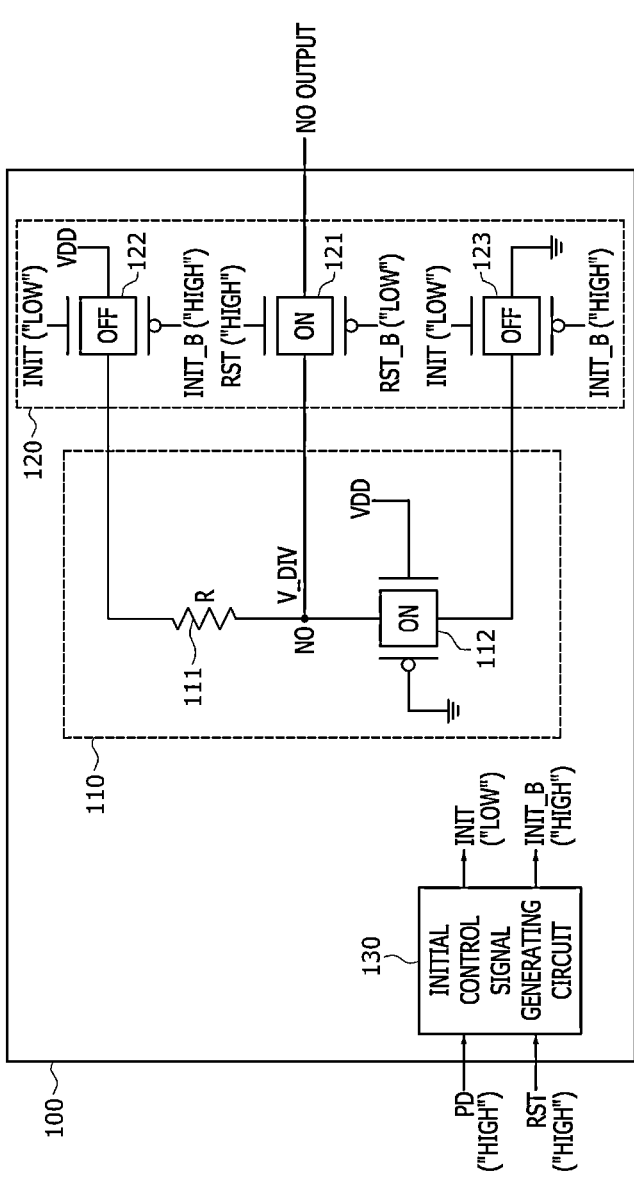
FIG. 7 is a schematic diagram illustrating an operation of the initial control voltage generating circuit of FIG. 1 when each of the power-down signal and the reset signal has a high-level, according to an embodiment of the present disclosure.

FIG. 6 is a circuit diagram illustrating the operation of the initial control signal generating circuit 130 of FIG. 2 when the power-down signal PD and the reset signal RST are both at a high level, according to an embodiment of the present disclosure. FIG. 7 is a schematic illustrating the operation of the initial control voltage generating circuit 100 of FIG. 1 when the power-down signal PD and the reset signal RST are both at a high level, according to an embodiment of the present disclosure. In FIG. 6, the same reference numerals as in FIG. 2 indicate the same components, and in FIG. 7, the same reference numerals as in FIG. 1 indicate the same components.

First, as shown in FIG. 6, during the time interval before the initialization operation is performed (e.g., referring to FIG. 3, before the first time point T1 or after the third time point T3), a high-level power-down signal PD is input to the first inverter 131, and a high-level reset signal RST is input to the second input terminal of the NAND gate 132. The first inverter 131 outputs a low-level power-down bar signal PD_B and transmits the low-level power-down bar signal PD_B to the first input terminal of the NAND gate 132. The NAND gate 132 performs a NAND operation on the low-level power-down bar signal PD_B and the high-level reset signal RST to output the high-level initial control signal bar INIT_B. The second inverter 133, which receives the high-level initial control bar signal INIT_B from the NAND gate 132, outputs the low-level initial control signal INIT.

Next, as shown in FIG. 7, a high-level reset signal RST and a low-level reset bar signal RST_B are input to the gate of the NMOS transistor and the gate of the PMOS transistor of the first transmission gate switch 121, respectively. Accordingly, the first transmission gate switch 121 is switched on (or turned on). A low-level initial control signal INIT output from the initial control signal generating circuit 130 is input to the gate of the NMOS transistor of the second transmission gate switch 122 and the gate of the NMOS transistor of the third transmission gate switch 123. A high-level initial control bar signal INIT_B output from the initial control signal generating circuit 130 is input to the gate of the PMOS transistor of the second transmission gate switch 122 and the gate of the PMOS transistor of the third transmission gate switch 123. Accordingly, the second transmission gate switch 122 and the third transmission gate switch 123 are also switched off (or turned off).

As the second transmission gate switch 122 is switched off, the resistor 111 of the voltage divider circuit 110 and the supply voltage VDD terminal are disconnected from each other. As the third transmission gate switch 123 is switched off, the output terminal of the transmission gate resistor 112 of the voltage divider circuit 110 and the ground voltage terminal are disconnected from each other. As the supply voltage VDD and the ground voltage are applied to the gate of the NMOS transistor and the gate of the PMOS transistor of the transmission gate resistor 112, respectively, the transmission gate resistor 112 remains turned on, but since the one terminal of the resistor 111 and the input terminal of the transmission gate resistor 112 are both in a floating state, no voltage is applied to the output node NO. Therefore, the control voltage V_CTRL is not output through the output terminal of the first transmission gate switch 121.

Figure 8:
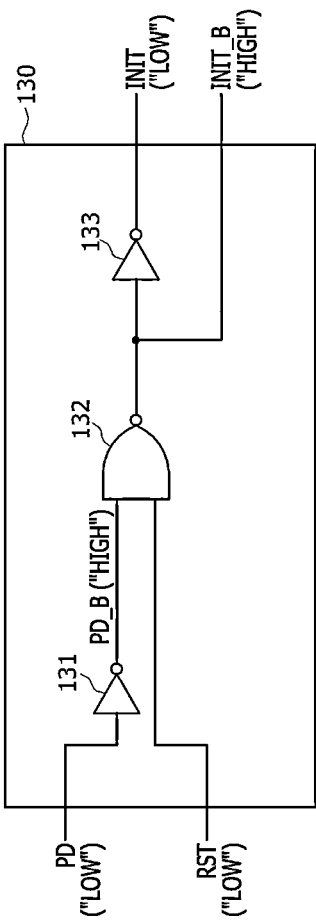
FIG. 8 is a schematic diagram illustrating an operation of the initial control signal generating circuit of FIG. 2 when each of the power-down signal and the reset signal has a low-level, according to an embodiment of the present disclosure.

FIG. 8 is a circuit diagram illustrating an operation of the initial control signal generating circuit 130 of FIG. 2 when both the power-down signal PD and the reset signal RST are low-level, according to an embodiment of the present disclosure. In FIG. 8, the same reference numerals as in FIG. 2 denote the same components.

Referring to FIG. 8, during the time interval after the initialization operation is completed and before the power goes down again (e.g., the time interval from the second time point T2 to the third time point T3 in FIG. 3), a low-level power-down signal PD is input to the first inverter 131, and a low-level reset signal RST is input to the second input terminal of the NAND gate 132. The first inverter 131 outputs a high-level power-down bar signal PD_B and transmits the high-level power-down bar signal PD_B to the first input terminal of the NAND gate 132. The NAND gate 132 outputs a high-level initial control bar signal INIT_B by performing a NAND operation on the high-level power-down bar signal PD_B and the low-level reset signal RST. The second inverter 133, which receives the high-level initial control bar signal INIT_B from the NAND gate 132, outputs the low-level initial control signal INIT. Since the initial control signal generating circuit 130 outputs the low-level initial control signal INIT and the high-level initial control bar signal INIT_B, the operation of the initial control voltage generating circuit 100 of FIG. 1 is the same as described with reference to FIG. 7.

Figure 9:
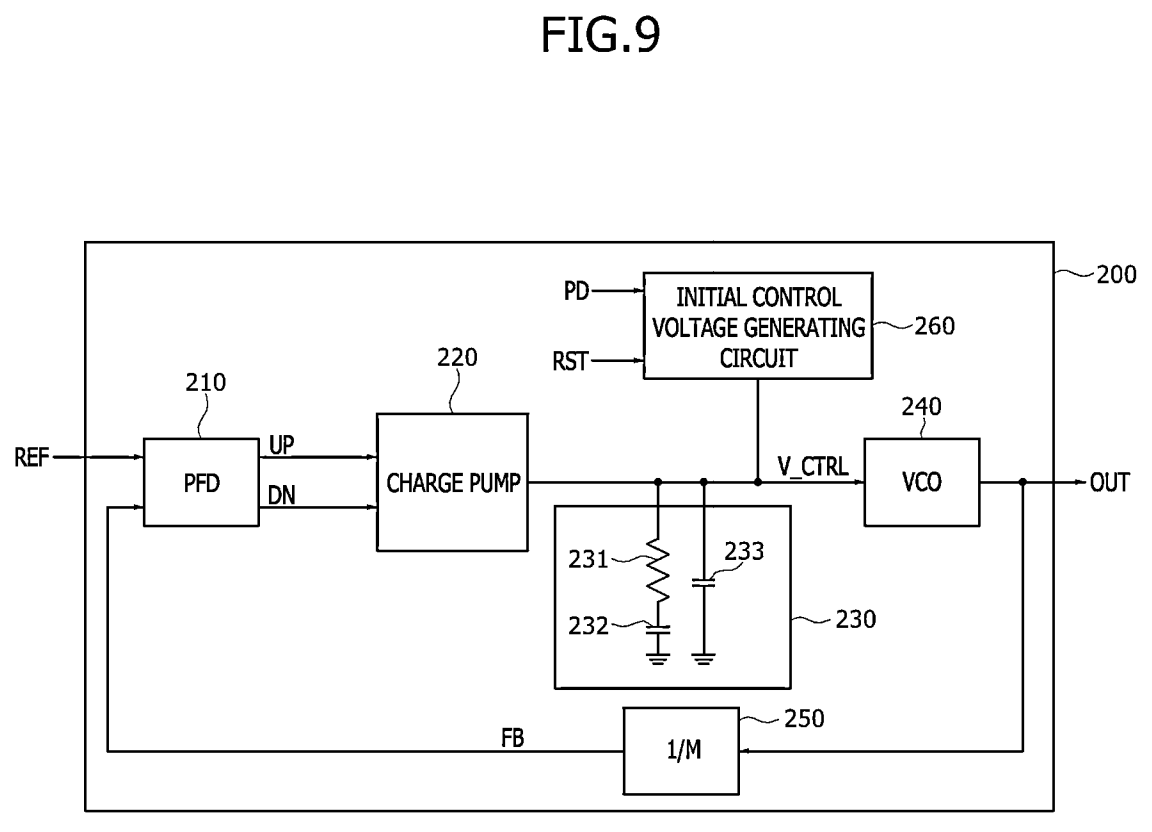

FIG. 9 is a block diagram illustrating a PLL circuit 200 including an initial control voltage generating circuit 260, according to an embodiment of the present disclosure. For example, the initial control voltage generating circuit 100 in FIG. 1 may be suitable for use as the initial control voltage generating circuit 260.

Referring to FIG. 9, the PLL circuit 200 may include a phase frequency detector PFD 210, a charge pump 220, a loop filter 230, a VCO 240, a frequency divider 250, and an initial control voltage generating circuit 260. The PLL circuit 200 receives a reference signal REF and outputs an output signal OUT having a constant frequency based on the reference signal REF. The VCO 240 of the PLL circuit 200 generates an output signal OUT based on the control voltage V_CTRL provided by the initial control voltage generating circuit 260 during an initialization time interval when the power-down signal PD is at a low level and the reset signal RST is at a high level. After the initialization time interval, the VCO 240 generates an output signal OUT based on the control voltage V_CTRL provided by the charge pump 220 and the loop filter 230. The initial control voltage generating circuit 260 may be configured identically to the initial control voltage generating circuit 100 described with reference to FIGS. 1 through 8. Accordingly, the initialization process described with reference to FIGS. 1 to 8 is applicable to the PLL circuit 200.

The phase frequency detector 210 receives a reference signal REF and a feedback signal FB as inputs. In one example, the reference signal REF may be provided by a crystal oscillator. The phase frequency detector 210 detects a phase difference between the reference signal REF and the feedback signal FB, and transmits the detected phase difference to the charge pump 220. In one example, the phase frequency detector 210 outputs an up-signal UP or a down-signal DN in the form of a pulse during each cycle of the reference signal REF based on the phase difference between the reference signal REF and the feedback signal FB. For example, when the phase of the reference signal REF leads the phase of the feedback signal FB, the phase frequency detector 210 outputs an up-signal UP. The width of the up-signal UP may be proportional to the phase difference. When the phase of the reference signal REF lags the phase of the feedback signal FB, the phase frequency detector 210 outputs a down-signal DN. The width of the down-signal DN may also be proportional to the phase difference.

The charge pump 220 outputs a control voltage V_CTRL based on an up-signal UP or a down-signal DN provided by the phase frequency detector 210. In one example, when an up-signal UP is transmitted from the phase frequency detector 210, the charge pump 220 outputs a control voltage V_CTRL increased by a magnitude corresponding to a charge quantity corresponding to a pulse width of the up-signal UP. When a down-signal DN is transmitted from the phase frequency detector 210, the charge pump 220 outputs a control voltage V_CTRL that is reduced by a magnitude corresponding to a charge quantity that corresponds to the pulse width of the down-signal DN. In one example, the charge pump 220 may be configured to include a first current source, a second current source, a first switch, and a second switch.

A loop filter 230 is disposed between the charge pump 220 and the VCO 240. In one example, the loop filter 230 may be configured as a low pass filter comprising a resistor 231 and capacitors 232 and 233. The capacitors 232 and 233 of the loop filter 230 may accumulate charge provided by the charge pump 220, or discharge the accumulated charge to the charge pump 220. This accumulation or discharge of charges in the loop filter 230 is accomplished by the operation of the charge pump 220 in response to an up-signal UP or down-signal DN output from the phase frequency detector 210. For example, when an up-signal UP is provided to the charge pump 220, the charge pump 220 pushes electric charges corresponding to the pulse width of the up-signal UP, and the electric charges pushed from the charge pump 220 is charged to the capacitors of the loop filter 230. When the down-signal DN is provided to the charge pump 220, the charge pump 220 attracts electric charges corresponding to the pulse width of the down-signal DN, and the charges accumulated in the capacitors of the loop filter 230 is released to the charge pump 220. On the other hand, as the loop filter 230 is configured as a low-pass filter, harmonics and noise of the control voltage V_CTRL may be substantially removed by the loop filter 230.

The VCO 240 receives a control voltage V_CTRL from the initial control voltage generating circuit 260 during the initialization period and a control voltage V_CTRL from the charge pump 220 during a normal operation period after the initialization period. The VCO 240 generates and outputs an output signal OUT based on the control voltage V_CTRL from the initial control voltage generating circuit 260 or the control voltage V_CTRL from the charge pump 220. In one example, the VCO 240 may be configured as a ring oscillator structure. In another example, the VCO 240 may comprise a structure including an inductor-capacitor (LC) tank.

The frequency divider 250 receives an output signal OUT from the VCO 240 as input. The frequency divider 250 generates a feedback signal FB having a frequency of 1/M of the output signal OUT and transmits the feedback signal FB to the phase frequency detector 210. In one example, the frequency of the output signal OUT may be changed by changing the multiplication factor (i.e., "M") of the frequency divider 250.

Figure 10:
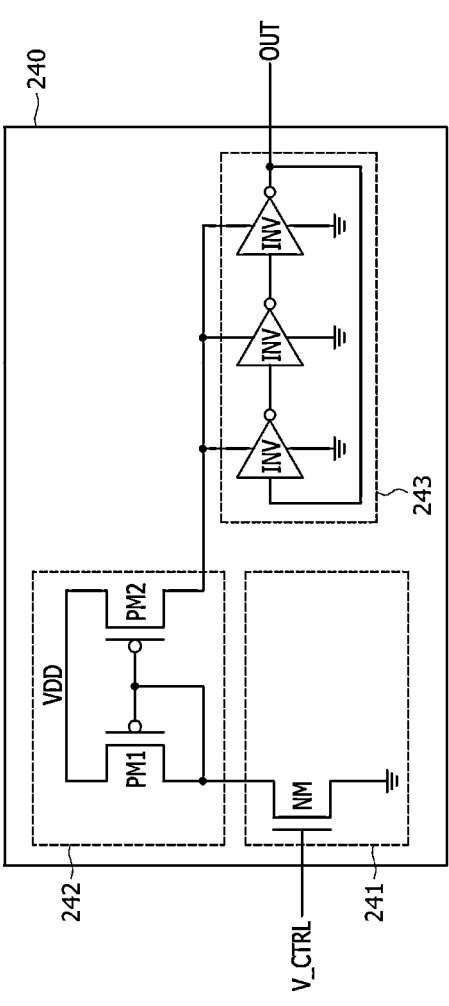
FIG. 10 is a block diagram illustrating a VCO included in the PLL circuit of FIG. 9 according to an embodiment of the present disclosure.

FIG. 10 is a schematic illustrating a VCO 240 included in the PLL circuit 200 of FIG. 9 according to an embodiment of the present disclosure. In this example, the VCO 240 is a current starved ring oscillator structure, but embodiments of the present disclosure are not limited thereto. For example, the VCO 240 may comprise any other types, such as a structure comprising an LC tank.

Referring to FIG. 10, the VCO 240 may include a bias circuit 241, a current mirror circuit 242, and an inverter chain circuit 243. The bias circuit 241 may include a NMOS transistor NM coupled to the current mirror circuit 242 and a ground voltage. A control voltage V_CTRL is applied to the gate of the NMOS transistor NM. The drain and source of the NMOS transistor NM are coupled to the current mirror circuit 242 and a ground voltage terminal, respectively. Although not shown, a resistor may be disposed between the source of the NMOS transistor NM and the ground voltage terminal. The NMOS transistor NM provides a current to the current mirror circuit 242 that is linearly proportional to the control voltage V_CTRL applied to the gate.

The current mirror circuit 242 may include a first PMOS transistor PM1 and a second PMOS transistor PM2 whose gates are coupled to each other. A source of the first PMOS transistor PM1 and a source of the second PMOS transistor PM2 are coupled to a supply voltage VDD. The drain of the first PMOS transistor PM1 is commonly coupled with the drain of the NMOS transistor NM, the gate of the first PMOS transistor PM1, and the gate of the second PMOS transistor PM2. The drain of the second PMOS transistor PM2 is coupled to the inverter chain circuit 243. The current mirror circuit 242 mirrors the current provided by the bias circuit 241 and provides the mirrored current to the inverter chain circuit 243.

The inverter chain circuit 243 includes a plurality of inverters, such as three inverters INVs, that are combined in a chain configuration. In one example, the number of inverters may be an odd number. The inverters form a loop, i.e., the output of the last inverter, i.e., the third inverter INV, is fed back to the input of the first inverter INV. The source of the PMOS transistor of each of the inverters INVs in the inverter chain circuit 243 is coupled to the drain of the second PMOS transistor PM2 of the current mirror circuit 242. The source of the NMOS transistor of each of the inverters INVs in the inverter chain circuit 243 is coupled to the ground voltage. The output signal OUT from the VCO 240 is output from the last inverter in the inverter chain circuit 243, the third inverter INV. The inverters INVs comprising the inverter chain circuit 243 may operate as an oscillator to generate a periodically repeated pulse signal. The inverter chain circuit 243 has a variable delay time depending on the amount of current provided by the current mirror circuit 242. For example, as the amount of current provided by the current mirror circuit 242 increases, the delay time of the inverters INVs may decrease. On the other hand, when the amount of current provided by the current mirror circuit 242 decreases, the latency of the inverters INV may increase.

Concepts have been disclosed in conjunction with some embodiments as described above. Various modifications, additions, and substitutions are possible.

What is claimed is:

1. An initial control voltage generating circuit for generating an initial control voltage and providing the initial control voltage to a voltage controlled oscillator (VCO), the circuit comprising:
   a resistor coupled between a supply voltage terminal and an output node from which the initial control voltage is output; and
   a transmission gate resistor coupled between the output node and a ground voltage terminal,
   wherein the resistor, the output node, and the transmission gate resistor are configured to operate as a voltage divider, and each of the resistor and the transmission gate resistor is configured to operate as a passive resistive element of the voltage divider.

2. The initial control voltage generating circuit of claim 1, wherein the transmission gate resistor includes a P-channel type MOS (PMOS) transistor and an N-channel type MOS (NMOS) transistor coupled in parallel between the output node and the ground voltage terminal, and
   wherein the PMOS transistor and NMOS transistor are configured to have a pair of transistor corners including any one of typical/typical (TT), fast/fast (FF), and slow/slow (SS).

3. The initial control voltage generating circuit of claim 2, wherein the transmission gate resistor has a turn-on resistance value substantially equal to a resistance value of the resistor when the PMOS transistor and the NMOS transistor have the TT transistor corners.

4. The initial control voltage generating circuit of claim 2, wherein the transmission gate resistor has a turn-on resistance value less than a resistance value of the resistor when the PMOS transistor and the NMOS transistor have the FF transistor corners.

5. The initial control voltage generating circuit of claim 2, wherein the transmission gate resistor has a turn-on resistance value greater than the resistance value of the resistor when the PMOS transistor and the NMOS transistor have the SS transistor corners.

6. The initial control voltage generating circuit of claim 2, wherein a gate of the PMOS transistor is coupled to the ground voltage terminal, and
   wherein a gate of the NMOS transistor is coupled to the supply voltage terminal.

7. The initial control voltage generating circuit of claim 1, further comprising an initial control signal generating circuit that generates a first initial control signal and a second initial control signal based on a power-down signal and a reset signal, the first and second initial control signals being complementary signals,
   wherein the power-down signal is changed from a first logic level to a second logic level at a first time when power is turned on, and
   wherein the reset signal is changed from the first logic level to the second logic level at a second time when an initialization period elapses from the first time.

8. The initial control voltage generating circuit of claim 7, wherein the initial control signal generating circuit comprising:
   a first inverter configured to receive the power-down signal and to output an inverted power-down signal;
   a NAND gate configured to perform a NAND operation on the inverted power-down signal and the reset signal and to output the second initial control signal; and
   a second inverter configured to receive the second initial control signal and to output the first initial control signal.

9. The initial control voltage generating circuit of claim 7, further comprising:
   a first switch configured to provide the initial control voltage from the output node therethrough;
   a second switch configured to connect or disconnect the resistor and the supply voltage terminal; and
   a third switch configured to connect or disconnect the transmission gate resistor and the ground voltage terminal.

10. The initial control voltage generating circuit of claim 9, wherein the first switch, the second switch, and the third switch are a first transmission gate switch, a second transmission gate switch, and a third transmission gate switch, respectively, wherein the first transmission gate switch is turned on when the reset signal has the first logic level, and wherein the second transmission gate switch and the third transmission gate switch are turned on when the power-down signal has the second logic level and the reset signal has the first logic level.

11. A phase locked loop (PLL) circuit comprising:

a phase frequency detector configured to receive a reference signal and a feedback signal and to output an up-signal or a down-signal based on a phase difference between the reference signal and the feedback signal;

a charge pump configured to output a control voltage based on the up-signal or down-signal;

a voltage controlled oscillator (VCO) configured to generate and output an output signal having a first frequency corresponding to the control voltage;

a frequency divider configured to generate the feedback signal having a second frequency and to transmit the feedback signal to the phase frequency detector; and an initial control voltage generating circuit configured to generate an initial control voltage during an initialization period and to provide the initial control voltage to the VCO, wherein the initial control voltage generating circuit includes:

a resistor coupled between a supply voltage terminal and an output node from which the initial control voltage is output; and a transmission gate resistor coupled between the output node and a ground voltage terminal, and wherein the resistor, the output node, and the transmission gate resistor are configured to operate as a voltage divider, and each of the resistor and the transmission gate resistor is configured to operate as a passive resistive element of the voltage divider.

12. The PLL circuit of claim 11, wherein the transmission gate resistor includes a P-channel type MOS (PMOS) transistor and an N-channel type MOS (NMOS) transistor coupled in parallel between the output node and the ground voltage terminal, and wherein the PMOS transistor and NMOS transistor are configured to have a pair of transistor corners including any one of typical/typical (TT), fast/fast (FF), and slow/slow (SS).

13. The PLL circuit of claim 12, wherein the transmission gate resistor has a turn-on resistance value substantially equal to a resistance value of the resistor when the PMOS transistor and the NMOS transistor have the TT transistor corners.

14. The PLL circuit of claim 12, wherein the transmission gate resistor has a turn-on resistance value less than a resistance value of the resistor when the PMOS transistor and the NMOS transistor have the FF transistor corners.

15. The PLL circuit of claim 12, wherein the transmission gate resistor has a turn-on resistance value greater than a resistance value of the resistor when the PMOS transistor and the NMOS transistor have the SS transistor corners.

16. The PLL circuit of claim 12, wherein a gate of the PMOS transistor is coupled to the ground voltage terminal, and wherein a gate of the NMOS transistor is coupled to the supply voltage terminal.

17. The PLL circuit of claim 11, wherein the initial control voltage generating circuit further comprises an initial control signal generating circuit that generates a first initial control signal and a second initial control signal based on a power-down signal and a reset signal, the first and second initial control signals being complementary signals, wherein the power-down signal is changed from a first logic level to a second logic level at a first time when power is turned on, and wherein the reset signal is changed from the first logic level to the second logic level at a second time when an initialization period elapses from the first time.

18. The PLL circuit of claim 17, wherein the initial control signal generating circuit comprises:

a first inverter configured to receive the power-down signal and to output an inverted power-down signal;

a NAND gate configured to perform a NAND operation on the inverted power-down signal and the reset signal and to output the second initial control signal; and a second inverter configured to receive the second initial control signal and to output the first initial control signal.

19. The PLL circuit of claim 17, wherein the initial control voltage generating circuit further comprises:

a first switch configured to provide the initial control voltage from the output node therethrough;

a second switch configured to connect or disconnect the resistor and the supply voltage terminal; and a third switch configured connect or disconnect the transmission gate resistor and the ground voltage terminal.

20. The PLL circuit of claim 19, wherein the first switch, the second switch, and the third switch are a first transmission gate switch, a second transmission gate switch, and a third transmission gate switch, respectively, wherein the first transmission gate switch is turned on when the reset signal has the first logic level, and wherein the second transmission gate switch and the third transmission gate switch are turned on when the power-down signal has the second logic level and the reset signal has the first logic level.

* * * * *